(12) United States Patent
Huang

(10) Patent No.: US 8,089,264 B2
(45) Date of Patent: Jan. 3, 2012

(54) VOLTAGE MEASURING CIRCUIT

(75) Inventor: Yong-Zhao Huang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 308 days.

(21) Appl. No.: 12/564,058

(22) Filed: Sep. 22, 2009

(65) Prior Publication Data
US 2011/0050203 A1 Mar. 3, 2011

(30) Foreign Application Priority Data
Sep. 2, 2009 (CN) .......................... 2009 1 0306488

(51) Int. Cl.
*G01R 19/00* (2006.01)
*H02H 3/20* (2006.01)
*H02H 3/24* (2006.01)
*H02H 9/04* (2006.01)

(52) U.S. Cl. ........................ 324/76.11; 361/90; 361/91.5
(58) Field of Classification Search ........................ None
See application file for complete search history.

(56) References Cited

U.S. PATENT DOCUMENTS

| | | | | |
|---|---|---|---|---|
| 4,803,459 A | * | 2/1989 | Ta ................. | 340/459 |
| 5,969,626 A | * | 10/1999 | Maciel .......... | 340/649 |
| 6,411,482 B1 | * | 6/2002 | Funke .......... | 361/91.1 |

* cited by examiner

*Primary Examiner* — Roberto Velez
(74) *Attorney, Agent, or Firm* — Altis Law Group, Inc.

(57) ABSTRACT

A voltage measuring circuit includes an under-voltage measuring circuit and an over-voltage measuring circuit. The under-voltage measuring circuit includes a first voltage comparator, a first zener diode, and a first light emitting diode. An inverting input of the first voltage comparator is connected to a cathode of the first zener diode. An output of the first voltage comparator is connected to a cathode of the first light emitting diode. The over-voltage measuring circuit includes a second voltage comparator, a second zener diode, and a second light emitting diode. A non-inverting input of the second voltage comparator is connected to the cathode of the second zener diode. An output of the second voltage comparator is connected to a cathode of the second light emitting diode.

5 Claims, 1 Drawing Sheet

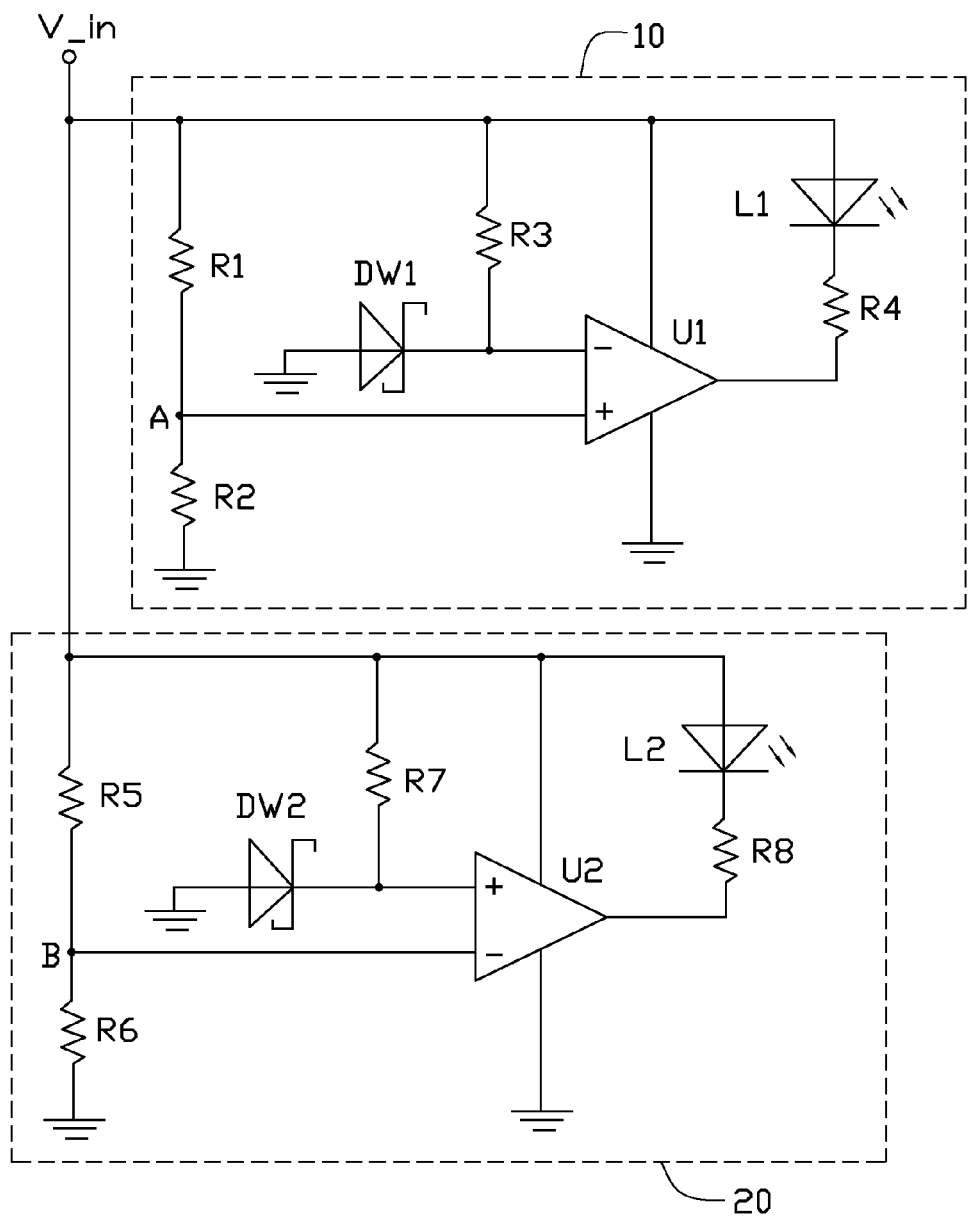

VOLTAGE MEASURING CIRCUIT

BACKGROUND

1. Technical Field

The present disclosure relates to a voltage measuring circuit.

2. Description of Related Art

Nowadays, an electronic device, such as a motherboard, usually includes an over-voltage protecting circuit and an under-voltage protecting circuit. When the voltage provided from a power source to the electronic device is over-voltage or under-voltage, the over-voltage protecting circuit or under-voltage protecting circuit of the electronic device will disconnect the power source to protect the electronic device. However, operators often do not know whether the power source is under-voltage or over-voltage when the power source is disconnected.

BRIEF DESCRIPTION OF THE DRAWINGS

The drawing is a circuit diagram of an exemplary embodiment of a voltage measuring circuit.

DETAILED DESCRIPTION

Referring to the drawing, an exemplary embodiment of a voltage measuring circuit includes an under-voltage measuring circuit 10 and an over-voltage measuring circuit 20.

The under-voltage measuring circuit 10 includes a first voltage comparator U1, a first zener diode DW1, a first light emitting diode L1, and four resistors R1, R2, R3, and R4.

The resistor R1 is connected to a power source V_in and is grounded via the resistor R2.

A cathode of the first zener diode DW1 is connected to the power source V_in via the resistor R3. An anode of the first zener diode DW1 is grounded.

An inverting input of the first voltage comparator U1 is connected to the cathode of the first zener diode DW1. A non-inverting input of the first voltage comparator U1 is connected to a node A between the resistors R1 and R2. An output of the first voltage comparator U1 is connected to a cathode of the first light emitting diode L1 via the resistor R4. A power pin of the first voltage comparator U1 is connected to the power source V_in, and a ground pin of the first voltage comparator U1 is grounded.

An anode of the first light emitting diode L1 is connected to the power source V_in.

The over-voltage measuring circuit 20 includes a second voltage comparator U2, a second zener diode DW2, a second light emitting diode L2, and four resistors R5, R6, R7, and R8.

The resistor R5 is connected to the power source V_in and is grounded via the resistor R6.

A cathode of the second zener diode DW2 is connected to the power source V_in via the resistor R7. An anode of the second zener diode DW2 is grounded.

A non-inverting input of the second voltage comparator U2 is connected to the cathode of the second zener diode DW2. An inverting input of the second voltage comparator U2 is connected to a node B between the resistors R5 and R6. An output of the second voltage comparator U2 is connected to a cathode of the second light emitting diode L2 via the resistor R8. A power pin of the second voltage comparator U2 is connected to the power source V_in, and a ground pin of the second voltage comparator U2 is grounded.

An anode of the second light emitting diode L2 is connected to the power source V_in.

When the power source V_in is normal, the voltage of the power source V_in is between an upper limit V-max and a lower limit V-min When the power source V_in is providing an under-voltage, the voltage of the power source V_in is less than the lower limit V-min When the power source V_in is providing an over-voltage, the voltage of the power source V_in is greater than the upper limit V-max.

The relationship of a stable voltage V-dw1 of the first zener diode DW1, a stable voltage V-dw2 of the second zener diode DW2, a voltage of the node A V-a, a voltage of the node B V-b, the voltage of the power source V_in, and resistances of the resistors R1, R2, R5, R6 is shown as below:

$$V\text{-}dw1 = V\text{-}min \times R2/(R1+R2),$$

$$V\text{-}dw2 = V\text{-}max \times R6/(R5+R6),$$

$$V\text{-}a = V\text{-}in \times R2/(R1+R2),$$

$$V\text{-}b = V\text{-}in \times R6/(R5+R6).$$

When the power source V_in is normal, the voltage of the power source V_in is between the upper limit V-max and the lower limit V-min. The voltage of the node A V-a is greater than the stable voltage V-dw1 of the first zener diode DW1, which means the voltage of the non-inverting input of the first voltage comparator U1 is greater than the voltage of the inverting input of the first voltage comparator U1. A voltage of the output of the first voltage comparator U1 is at a high level. The first light emitting diode L1 is not lit. The voltage of the node B V-b is less than the stable voltage V-dw2 of the second zener diode DW2, which means the voltage of the non-inverting input of the second voltage comparator U2 is greater than the voltage of the inverting input of the second voltage comparator U2. A voltage of the output of the second voltage comparator U2 is at a high level. The second light emitting diode L2 is not lit.

When the power source V_in is under-voltage, the voltage of the power source V_in is less than the lower limit V-min. The voltage of the node B V-b is less than the stable voltage V-dw2 of the second zener diode DW2, which means the voltage of the non-inverting input of the second voltage comparator U2 is greater than the voltage of the inverting input of the second voltage comparator U2. A voltage of the output of the second voltage comparator U2 is at a high level. The second light emitting diode L2 is not lit. The voltage of the node A V-a is less than the stable voltage V-dw1 of the first zener diode DW1, which means the voltage of the non-inverting input of the first voltage comparator U1 is less than the voltage of the inverting input of the first voltage comparator U1. A voltage of the output of the first voltage comparator U1 is at a low level. The first light emitting diode L1 lights to represent that the power source V_in is under-voltage.

When the power source V_in is over-voltage, the voltage of the power source V_in is greater than the upper limit V-max. The voltage of the node A V-a is greater than the stable voltage V-dw1 of the first zener diode DW1, which means the voltage of the non-inverting input of the first voltage comparator U1 is greater than the voltage of the inverting input of the first voltage comparator U1. A voltage of the output of the first voltage comparator U1 is at a high level. The first light emitting diode L1 is not lit. The voltage of the node B V-b is greater than the stable voltage V-dw2 of the second zener diode DW2, which means the voltage of the non-inverting input of the second voltage comparator U2 is less than the voltage of the inverting input of the second voltage comparator U2. A voltage of the output of the second voltage comparator U2 is at a low level. The second light emitting diode L2 lights to represent that the power source V_in is over-voltage.

The resistance of the second resistor equals to the resistance of the third resistor. The resistance of the sixth resistor equals to the resistance of the seventh resistor.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A voltage measuring circuit, comprising:
    an under-voltage measuring circuit, comprising a first resistor, a second resistor, a first voltage comparator, a first zener diode, and a first light emitting diode, wherein a cathode of the first zener diode is connected to a power source via a third resistor, an anode of the first zener diode is grounded, an inverting input of the first voltage comparator is connected to the cathode of the first zener diode, a non-inverting input of the first voltage comparator is connected to the power source via the first resistor and grounded via the second resistor, an output of the first voltage comparator is connected to a cathode of the first light emitting diode, an anode of the first light emitting diode is connected to the power source, wherein a relationship of a stable voltage V-dw1 of the first zener diode, a lower limit V-min of the power source, a resistance R1 of the first resistor, and a resistance R2 of the second resistor is that V-dw1=V-min× R2/(R1+R2); and
    an over-voltage measuring circuit, wherein the over-voltage measuring circuit comprises a fourth resistor, a fifth resistor, a second voltage comparator, a second zener diode, and a second light emitting diode, a cathode of the second zener diode is connected to the power source via a sixth resistor, an anode of the second zener diode is grounded, a non-inverting input of the second voltage comparator is connected to the cathode of the second zener diode, an inverting input of the second voltage comparator is connected to the power source via the fourth resistor and grounded via the fifth resistor, an output of the second voltage comparator is connected to a cathode of the second light emitting diode, an anode of the second light emitting diode is connected to the power source, wherein a relationship of stable voltage V-dw2 of the second zener diode, an upper limit V-max of the power source, a resistance R4 of the fourth resistor, and a resistance R5 of the fifth resistor is that V-dw2=V-max×R5/(R4+R5).

2. The voltage measuring circuit of claim 1, wherein the resistance of the first resistor equals to the resistance of the second resistor.

3. The voltage measuring circuit of claim 1, wherein the under-voltage measuring circuit further comprises a seventh resistor, the seventh resistor is connected between the output of the first voltage comparator and the cathode of the first light emitting diode.

4. The voltage measuring circuit of claim 1, wherein the resistance of the fourth resistor equals to the resistance of the fifth resistor.

5. The voltage measuring circuit of claim 1, wherein the over-voltage measuring circuit further comprises an eighth resistor, the eighth resistor is connected between the output of the second voltage comparator and the cathode of the second light emitting diode.

* * * * *